United States Patent [19]

Rich

[11] 4,428,632
[45] Jan. 31, 1984

[54] COAXIAL CABLE TRANSITION CONNECTOR

[75] Inventor: Donald S. Rich, Flanders, N.J.

[73] Assignee: Thomas & Betts Corporation, Raritan, N.J.

[21] Appl. No.: 65,638

[22] Filed: Aug. 10, 1979

[51] Int. Cl.³ .................... H01R 9/09; H01R 17/12
[52] U.S. Cl. ............................ 339/17 C; 333/260; 339/177 R
[58] Field of Search ............ 339/17 R, 17 C, 17 LC, 339/177 R, 177 E, 198 J, 276 A; 333/260

[56] References Cited

U.S. PATENT DOCUMENTS

| | | | |
|---|---|---|---|
| 1,923,939 | 8/1933 | Lavarack | 339/198 J |
| 3,179,912 | 4/1965 | Huber et al. | 339/177 R |
| 3,260,791 | 7/1966 | Shelley | 339/276 A |
| 3,482,201 | 12/1969 | Schneck | 339/14 |
| 3,573,704 | 4/1971 | Tarver | 339/14 |
| 3,634,806 | 1/1972 | Fergusson | 339/14 R |
| 3,691,429 | 9/1972 | Glaser | 339/17 C |
| 3,757,272 | 9/1973 | Laramee et al. | 339/177 R |
| 3,879,103 | 4/1975 | Peltola et al. | 339/177 R |
| 4,125,308 | 11/1978 | Schilling | 339/17 LC |

*Primary Examiner*—Neil Abrams
*Attorney, Agent, or Firm*—Robert M. Rodrick; Salvatore J. Abbruzzese

[57] ABSTRACT

A transition connector for interconnecting a standard coaxial cable to a microcoaxial cable employing a uniquely configured printed circuit module to preserve the integrity of signal transmission by providing controlled impedance paths between the desired cable termination points. The connectors or wire wrap posts to accept the cables are placed upon the module substrate which in turn is mounted in a protected floor-mounted pedestal. By the use of appropriate jumpers, the transition connector can be used as a splice for either the microcoaxial or standard coaxial cables.

7 Claims, 6 Drawing Figures

COAXIAL CABLE TRANSITION CONNECTOR

BACKGROUND OF THE INVENTION

1. Field of the Invention

The invention relates to the field of interconnecting coaxial cables of different sizes and characteristic impedances, particularly where a transmission cable must be run under carpets or within furniture to interconnect electronic equipment.

2. Description of the Prior Art

Often in the prior art, in order to connect equipment having cables of different physical size and construction together it was necessary to construct matching networks of resistors and capacitors with attendant phase shifts and loss of power. Also, the special connectors employed with each of the types of cables do not lend themselves to interconnection except with special adapters. The connectors themselves require a great deal of skill for installation and expensive equipment. Thus, to make an effective interconnection, special tools, skill, adapters and matching networks would be necessary and result in a large, bulky, unsightly connection not easily hidden from view.

SUMMARY OF THE INVENTION

The present invention overcomes the difficulties noted above with prior art techniques for joining two cables of different physical size and construction, one of which is run under the carpet of an office or the like. A transition connector for interconnecting a standard coaxial cable with its usual BNC connector to a microcoaxial cable either with an SMA connector or unterminated is shown. A uniquely configured printed circuit module is employed to preserve the integrity of the signal transmission by providing controlled impedance paths between the desired cable termination points. The connectors or wire wrap posts to accept the cables are placed upon the module substrate which in turn is mounted in a protected floor-mounted pedestal. One or more substrates, with or without a shield, may be so mounted. The use of jumpers of standard or microcoaxial cables with appropriate terminations can turn the connector into a splice for the remaining cables. It is an object of this invention to provide a transition connector for coaxial cables of different types.

It is another object of this invention to provide a transition connector for cables of different physical size and construction.

It is yet another object of this invention to provide a transition connector for coaxial cables with an impedance matching device in the pathway between the cable terminations.

It is another object of this invention to provide a transition connector for coaxial cables which can be mounted within a floor pedestal.

It is still another object of this invention to provide a transition connector which employs standard connectors and wire wrap post terminations.

Other objects and features of the invention will be pointed out in the following description and claims and illustrated in the accompanying drawings, which disclose, by way of example, the principles of the invention, and the best modes which have been contemplated for carrying them out.

BRIEF DESCRIPTION OF THE DRAWINGS

In the drawings in which similar elements are given similar reference characters.

DESCRIPTION OF THE PREFERRED EMBODIMENT

Figure 1:
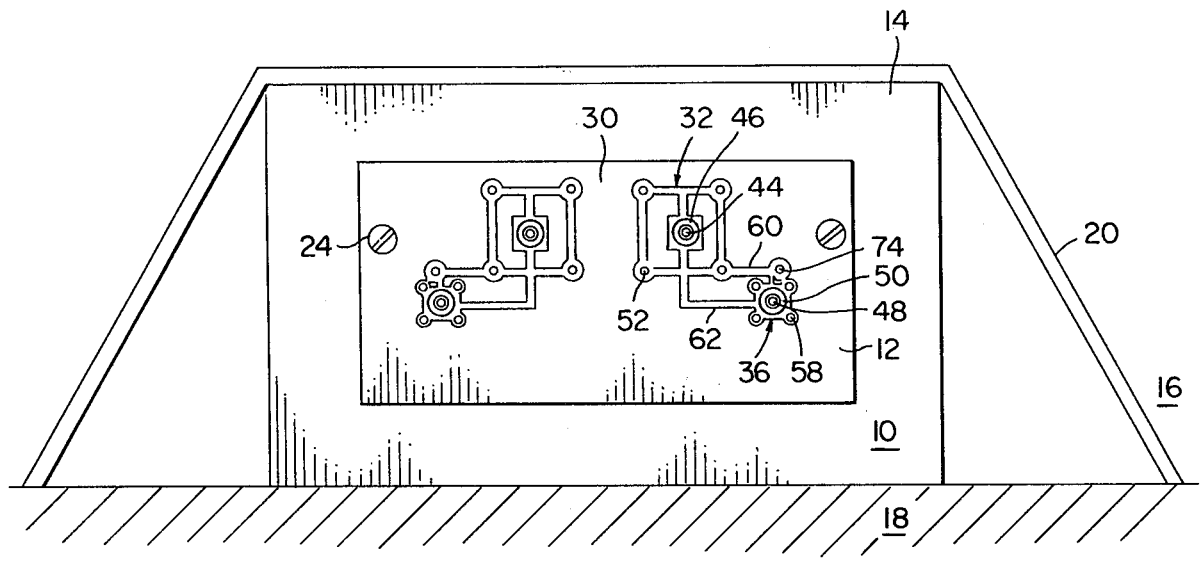
FIG. 1 is a front elevational view of a transition connector constructed in accordance with the concepts of the invention with the cable terminations omitted.
Figure 2:
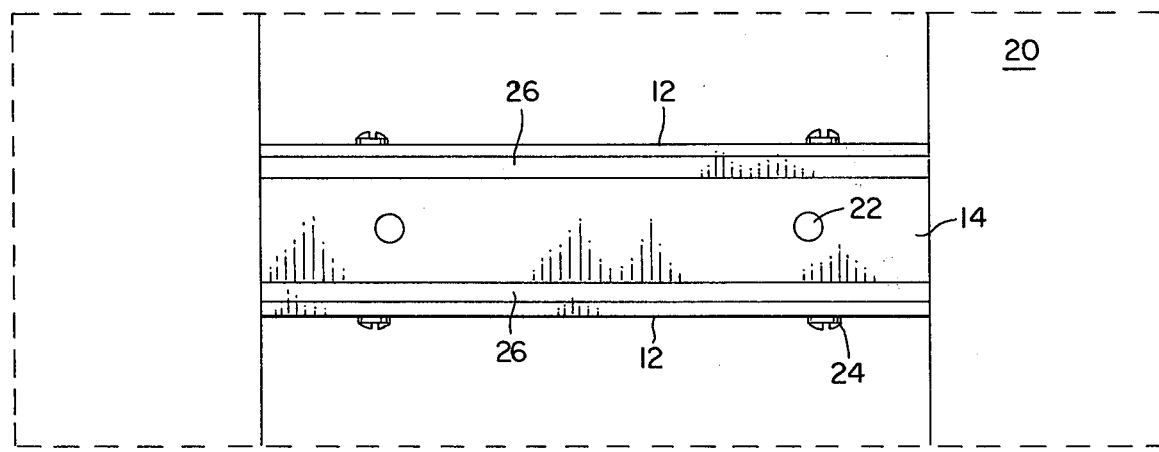
FIG. 2 is a top plan view of the transition connector of FIG. 1 with the cover shown in dotted line so that the mounting details of the connector can be better appreciated.
Figure 3:
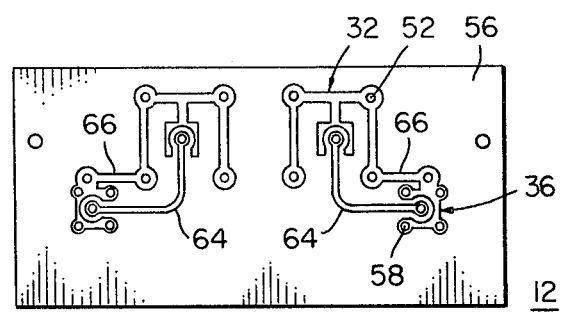
FIG. 3 is a side elevation of the back side of the printed circuit board of the connector of FIG. 1.

Turning now to FIGS. 1 to 4, there is shown a transition connector 10 constructed in accordance with the concepts of the invention. Substrate 12 is shown mounted to support 14 of floor mounted pedestal 16. Support 14 is mounted to the floor 18 by means (not shown) and the cover 20 is attached by fasteners (not shown) through apertures therein (not shown) into threaded apertures 22 in support 14. Substrates 12 can then be mounted to the support 14 by fasteners 24. As is shown in FIG. 2, two substrates 12 are mounted, one on each face of the support 14. In addition, a shield 26 has been inserted behind each substrate 12 adjacent a face of support 14. This places the central conductor between ground conductors and completely isolates it electrically. However, if desired, the shields 26 may be omitted since the ground plane of the printed circuit board should serve as an adequate shield. If desired, only one substrate 12 may be applied to the support 14 or the substrate 12 can be mounted directly to a mounting surface such as a wall or equipment cabinet or the like.

Figure 4:
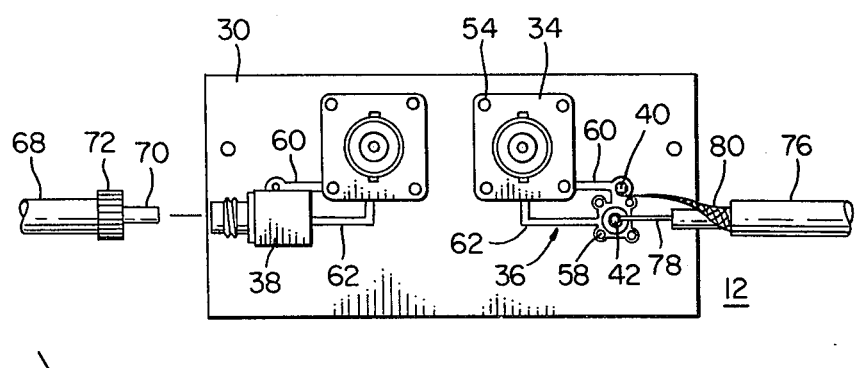
FIG. 4 is a side elevation of the printed circuit board of FIG. 1 with the cable terminations and cable installed.

Substrate 12 has two sets of traces on surface 30 composed of a portion 32 to accommodate a standard BNC (Bayonet Neal Counselman) female connector 34 (see FIG. 4) and a portion 36 to accommodate a SMA (Subminiature) male connector 38 (see FIG. 4) or wire wrap pins 40, 42 (see FIG. 4). Portion 32 has a central, fully insulated aperture 44 separated by insulation 46 to receive the central conductor (signal contact) of the BNC connector 34. Similarly, portion 36 has a fully insulated aperture 48 separated by insulation 50 to receive the central conductor of one SMA connector 38 or the wire wrap post 42 to which the central conductor of a microcoaxial cable will be attached. Surrounding insulated aperture 44 is a ground pattern which corresponds to the square base shape of the BNC connector 34 with mounting apertures 52 therein. To mount the BNC connector 34, its mounting pins 54 are inserted into apertures 52 and wave-soldered or otherwise attached to the backside 56 of substrate 12. This not only mounts the BNC connector 34 to the substrate 12 but insures a continuous ground between the substrate 12 and BNC connector 34. In a similar fashion, aperture 48 is surrounded by a ground pattern corresponding to the square base shape of the SMA connector 38 with mounting apertures 58 therein. The mounting pins or ground contacts (not shown) of the SMA connector 38 are inserted into mounting apertures 58 and are wave-soldered or otherwise fastened to the backside 56 of substrate 12.

Portion 32 is coupled to portion 36 directly by ground trace 60. In addition, portions 32 and 36 are coupled by ground trace 62 which, as will be described below, is directly behind the trace coupling the central apertures 44 and 48 and is in registry therewith to provide the desired shielding of the so-called "hot" conductor. As is clearly seen in FIG. 3, which is the backside 56 of the substrate 12, central aperture 44 is directly connected to central aperture 48 by trace 64. A pattern of traces joins the apertures 52 of portion 36 and is coupled by trace 66 to the traces joining the apertures 58 of portion 36.

As is shown in FIG. 4, two BNC connectors 34 are joined to the substrate 12. The pins 54 of the connectors 34 extend through mounting apertures 52 and are fastened to backside 56. The central conductor is inserted into central aperture 44 and also fastened to backside 56. On the left of substrate 12, a SMA connector 38 is mounted by extending its mounting pins through mounting apertures 58 and fastening to backside 56. Its central conductor will extend through aperture 48 and be fastened to backside 56. By virtue of trace 64, there will be a complete conductive path between the central conductors of connectors 34, 38 respectively. By controlling the width of trace 64, the spacing between traces 64 and 62 and the dielectric constant of the material from which the substrate 12 is constructed the impedance of the standard coaxial cable attached to connector 34 and the microcoaxial cable attached to connector 38 can be matched to prevent reflections, loss of power, etc. Microcoaxial cable 68 has a suitable female connector 70 which will be joined to male SMA connector 38 by gland nut 72.

On the right side of substrate 12 are mounted wire wrap pins 40, 42 in apertures 44, 48 respectively. Pin 42, arranged to receive the central conductor 78 of microcoaxial cable 76, is joined to the central conductor of the BNC connector 34 by the trace 64. Similarly, pin 40 is arranged to receive the shield 80 of cable 76 and is coupled to the body of the BNC connector 34 by the trace 60. Conductors 80 and 78 are joined to pins 40, 42 respectively by simple wire wrap tools.

Figure 5:
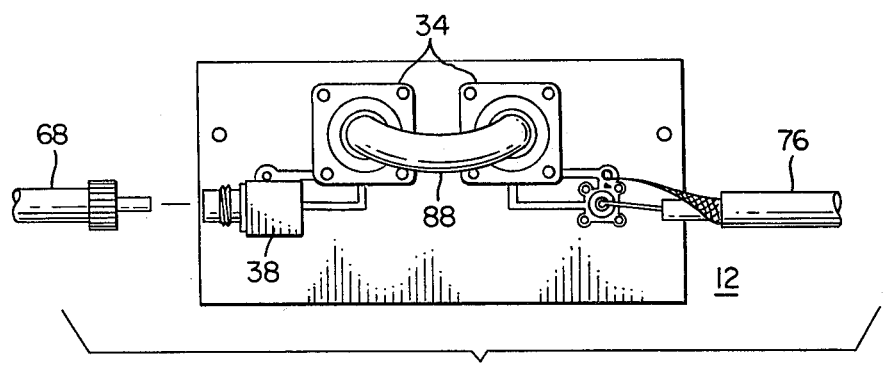
FIG. 5 is a side elevational view of the connector of FIG. 4 arranged as a splice for two terminated microcoaxial cables.
Figure 6:
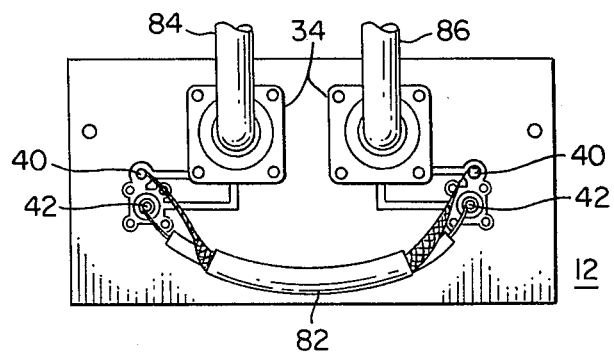
FIG. 6 is a side elevational view of the connector of FIG. 4 arranged as a splice for two terminated standard coaxial cables.

The substrate 12 can also be used as a splice to join two microcoaxial cables 68, 76 by jumping the two BNC connectors 34 with a length of cable 88 (see FIG. 5) suitably terminated with male BNC connectors on both ends. Also, as shown in FIG. 6, a length of microcoaxial cable 82 can be used to jumper the ends of cables 84, 86 connected to the BNC connectors 34.

While there have been shown and described and pointed out the fundamental novel features of the invention as applied to the preferred embodiments, it will be understood that various omissions and substitutions and changes of the form and details of the devices illustrated and in their operation may be made by those skilled in the art, without departing from the spirit of the invention.

The embodiments of the invention in which an exclusive property or privilege is claimed are defined as follows:

I claim:

1. A transition connector for joining two different coaxial cables, each having a signal conductor and a ground conductor comprising: a substrate; at least one first connector means mounted upon said substrate for receipt of a first coaxial cable and having signal and ground contacts; at least one second connector means mounted upon said substrate for receipt of a second coaxial cable and having signal and ground contacts; and trace means upon said substrate coupled to said first connector means and said second connector means for interconnecting said first and second coaxial cables and matching the characteristic impedances thereof, said trace means including a signal trace connecting said signal contacts of said first and second connector means and disposed on one side of said substrate, a first ground trace disposed on the side of said substrate opposite said one side and in trace-aligned registry with said signal trace, and a second ground trace electrically connected to said first ground trace and connecting said ground contacts of said first and second connector means.

2. A connector as defined in claim 1, wherein said first connector means is a BNC connector.

3. A connector as defined in claim 2, wherein said second connector means is a SMA connector.

4. A connector as defined in claim 2, wherein said second connector means is a pair of wire wrap pins.

5. A connector as defined in claim 1, wherein two of each of said first and second connector means are mounted in said substrate to permit the interconnection of three or more coaxial cables.

6. A connector as defined in claim 1, further comprising: support means for mounting at least one substrate thereon; and cover means coupled to said support means for protecting said substrates and cables coupled thereto.

7. A connector as defined in claim 1, wherein said second ground trace is in pattern configuration corresponding to the base shape of said first connector means.

* * * * *